United States Patent

Kikuchi et al.

[11] Patent Number: 6,038,515
[45] Date of Patent: Mar. 14, 2000

[54] PORTABLE INFORMATION TERMINAL APPARATUS CAPABLE OF CORRECTLY DETECTING POWER SUPPLY VOLTAGE

[75] Inventors: Tsuneyuki Kikuchi, Kanagawa; Hidehiro Matumoto, Tokyo, both of Japan

[73] Assignee: NEC Corporation, Tokyo, Japan

[21] Appl. No.: 08/965,523

[22] Filed: Nov. 6, 1997

[30] Foreign Application Priority Data

Nov. 29, 1996 [JP] Japan .................................. 8-320132

[51] Int. Cl.[7] ...................................................... G06F 1/00
[52] U.S. Cl. ............................................. 702/63; 320/149
[58] Field of Search ........................ 702/63, 64; 713/340; 320/149

[56] References Cited

U.S. PATENT DOCUMENTS

| | | | |
|---|---|---|---|
| 4,611,289 | 9/1986 | Coppola | 364/492 |
| 5,451,881 | 9/1995 | Finger | 324/433 |
| 5,481,730 | 1/1996 | Brown et al. | 395/750 |
| 5,635,813 | 6/1997 | Shiga et al. | 320/2 |
| 5,758,172 | 5/1998 | Seo | 395/750.01 |

FOREIGN PATENT DOCUMENTS

| | | |
|---|---|---|
| 0 592 965 | 4/1994 | European Pat. Off. . |
| 0 594 006 | 4/1994 | European Pat. Off. . |
| 0 636 897 | 2/1995 | European Pat. Off. . |
| 4-171429 | 6/1992 | Japan . |
| 5-22188 | 1/1993 | Japan . |

Primary Examiner—Timothy P. Callahan
Assistant Examiner—Linh Nguyen
Attorney, Agent, or Firm—Foley & Lardner

[57] ABSTRACT

In a portable information terminal system including a CPU and peripheral circuits, there is provided a discharge quantity table for storing remaining power levels. Each of the remaining power levels is defined based on a state of the portable information terminal system as a system state and a voltage of a power supply. A voltage detecting unit detects the power supply voltage in response to a voltage detection request. A control section monitors the system state, and issues the voltage detection request in response to a voltage check request. The control section refers to the discharge quantity table based on the power supply voltage detected by the voltage detecting unit and the monitored system state to determine the remaining power level of the power supply.

21 Claims, 14 Drawing Sheets

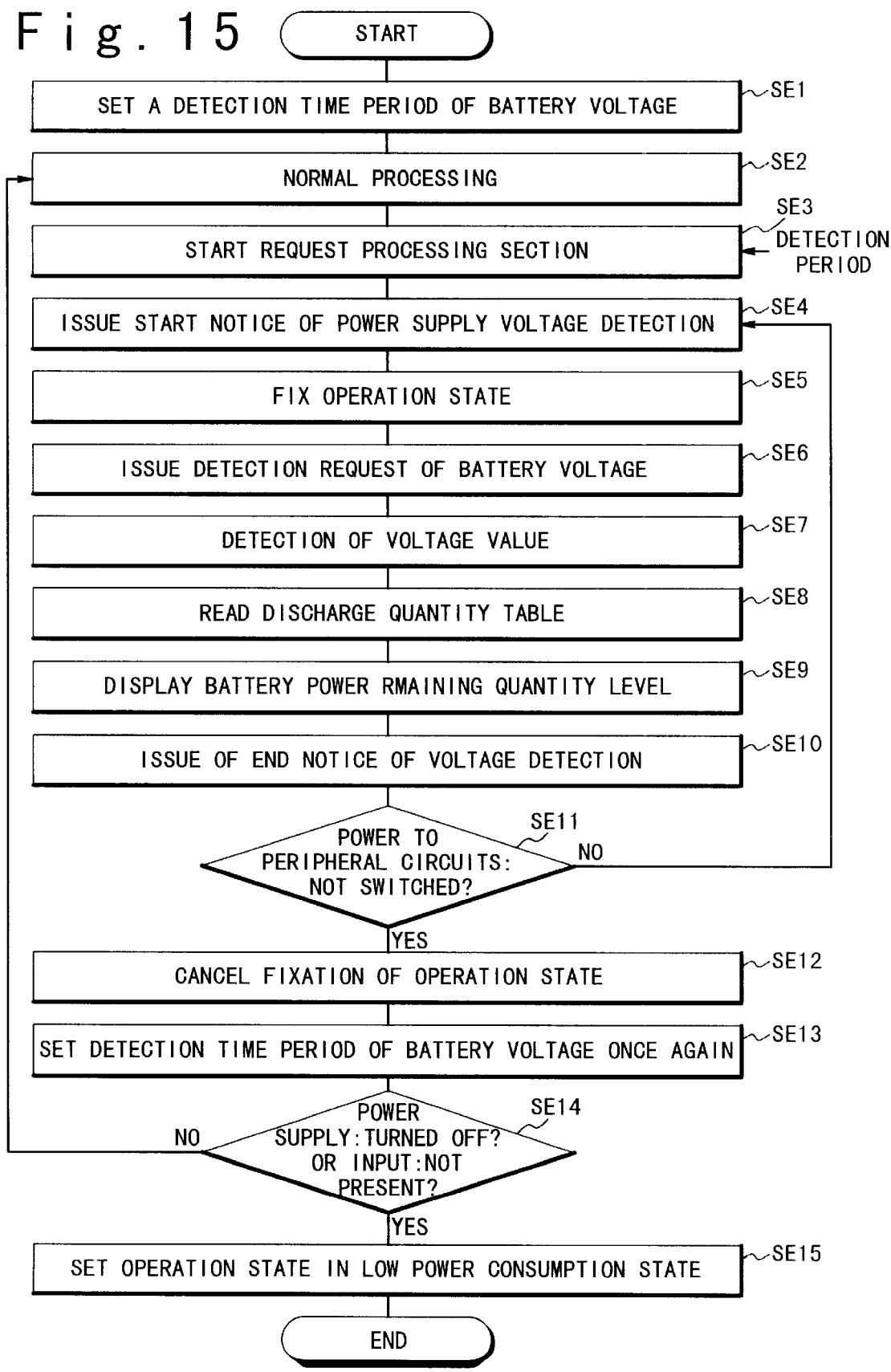

ent terminal apparatus, and more particularly a portable infor-

PORTABLE INFORMATION TERMINAL APPARATUS CAPABLE OF CORRECTLY DETECTING POWER SUPPLY VOLTAGE

BACKGROUND OF THE INVENTION

1. Field of the Invention

The present invention relates to a portable information terminal apparatus, and more particularly a portable information terminal apparatus which can correctly detect a power supply voltage.

2. Description of the Related Art

A conventional example of a detecting system for a power supply voltage in an apparatus which uses a battery as a power supply is described in, for example, Japanese Laid Open Patent Disclosure (JP-A-Heisei 4-171429: hereinafter, to be referred to as a first conventional example). In the first conventional example, a current is flows through a load from the power supply during the detection of the power supply voltage and then the power supply voltage is determined based on the resistance of the load and the current value at that time.

FIG. 1 is a block diagram illustrating the structure of the detecting system in the above first conventional technique. Referring to FIG. 1, a CPU 102 first reads a duty factor, either a heavy load duty (for determining a maximum remaining power quantity) and a light load duty (for determining whether the remaining power quantity is sufficient) from an EEPROM 103. Next, the CPU 102 drives a transistor 104 with the heavy load duty which has been read from the EEPROM 103. It should be noted that a capacitor 107 and a diode 108 form a power supply filter. Because a dummy load current flows through a dummy load 105, the battery voltage (Vcc) reduces gradually. At this time, the voltage (Vdd) which is applied to a voltage detection IC 106 also reduces. In this case, a CPU 102 determines whether or not the output of the voltage detection IC 106 reaches a determination voltage. When the output of the voltage detection IC 106 is left in the high level, it is determined whether or not it passed for 10 ms after the supply of current to the dummy load 105 is started. When not passing for 10 ms, the control returns to the determination of whether or not the output of the voltage detection IC 106 reaches the determination voltage. In a case where the above-mentioned ON detecting means is used, the decrease of battery voltage (Vcc) is little when the remaining power of a battery 101 is maximum. Therefore, the voltage which is applied to the voltage detection IC 106 does not also reach the determination voltage. In accordance with, after the time period of 10 ms elapsed, the CPU 102 determines that the remaining power quantity is large and the result is displayed to the user. After that, the supply of current to the dummy load 105 is stopped and the detection of the battery voltage is ended.

However, in the first conventional example of the detecting system mentioned above, an unnecessary current is flowed to the dummy load in the detection of the battery voltage and the timing when the battery voltage is to be detected is not considered. Therefore, when the battery power capacity is sufficient, there is a case that the voltage detection is frequently performed. For this reason, there is a problem in that the lifetime of the battery has become short because the battery power is unnecessarily consumed for the detection of the battery voltage.

Further, there is the possibility that the battery voltage decreases by connecting the dummy load so that the circuit operates erroneously when the remaining power quantity is not enough.

The reason is that there is a case that the battery can supply current enough to operate a low power consumption circuit even if the remaining power quantity of the battery is decreased. At that time, the battery voltage for a peripheral circuit temporarily decreases, because a large amount of current flows temporarily when the power starts to be supplied from the battery to the dummy load.

Another reason is that because the power supply and/or a clock signal are turned ON or OFF, the load of the power supply changes so that the detection of the battery voltage can not be correctly performed.

These reasons will be specifically described with reference to FIG. 1 again. In the first conventional example shown in FIG. 1, because the load 109, which represents the operation state of a peripheral circuit, is not constant, the value of the current which flows through the load 109 changes and the detection of the battery voltage can not be correctly performed.

SUMMARY OF THE INVENTION

The present invention is made in the view of the above circumstances. Therefore, an object of the present invention is to provide a method of informing a power remaining quantity in which a battery power is prevented from being unnecessarily consumed for detection of a battery voltage, so that a useable time can be extended as far as it is possible, and a wireless portable information terminal apparatus for the same.

Another object of the present invention is to prevent an erroneous operation due to the decrease of a power supply voltage in a portable information terminal apparatus.

Still another object of the present invention is to provide a wireless portable information terminal apparatus in which data and programs stored therein can be prevented from being destroyed because of the above erroneous operation.

Further another object of the present invention is to a wireless portable information terminal apparatus in which a circuit for detecting a voltage can be simplified so that the apparatus can be cheaply supplied.

In order to achieve an aspect of the present invention, a portable information terminal system including a CPU and peripheral circuits, includes a power supply, a discharge quantity table for storing remaining power levels, each of which is defined based on a state of the portable information terminal system as a system state and a voltage of the power supply, a voltage detecting unit for detecting the power supply voltage in response to a voltage detection request, and a control section for monitoring the system state, for issuing the voltage detection request in response to a voltage check request, for referring to the discharge quantity table based on the power supply voltage detected by the voltage detecting unit and the monitored system state to determine the remaining power level of the power supply.

In this case, the system state is at least one of a state of supply of a clock signal to the CPU and the peripheral circuits and a state of supply of power to the peripheral circuits.

The portable information terminal system may further include a check request generating section for issuing the voltage check request to the control section for every predetermined time period. In this case, the predetermined time period is set by a user. Alternatively, the portable information terminal system may further includes a time period setting section for automatically setting the predetermined time period. The time period setting section sets the predetermined time period based on the detected remaining power level.

The portable information terminal system may further includes a locking section for locking an operation of the CPU in response to a lock instruction, when the control section further issues the lock instruction to the locking section in response to the voltage check request.

The control section may issue the voltage check request to the voltage detecting unit again when it is detected that an operation state of any of the peripheral circuits is changed during the power supply voltage detection. In this case, the control section detects whether the operation state of any of the peripheral circuit is changed, based on a processing amount of the peripheral circuits.

The portable information terminal system may further includes a display unit, and a display control section for displaying a data corresponding to the determined remaining power on the display unit.

In order to achieve another aspect of the present invention, a method of detecting a power supply voltage in a portable information terminal system including a CPU and peripheral circuits, includes the steps of:

monitoring the system state;

issuing a voltage detection request in response to a voltage check request;

detecting the power supply voltage in response to the voltage detection request; and referring to a discharge quantity table based on the power supply voltage detected by the voltage detecting unit and the monitored system state to determine the remaining power level of the power supply, wherein the discharge quantity table for storing remaining power levels, each of which is defined based on a state of the portable information terminal system as a system state and a voltage of the power supply.

BRIEF DESCRIPTION OF THE DRAWINGS

FIG. 15 is a flow chart used to explain the operation of the wireless portable information terminal apparatus according to a sixth embodiment of the present invention.

DESCRIPTION OF THE PREFERRED EMBODIMENTS

Figure 1:
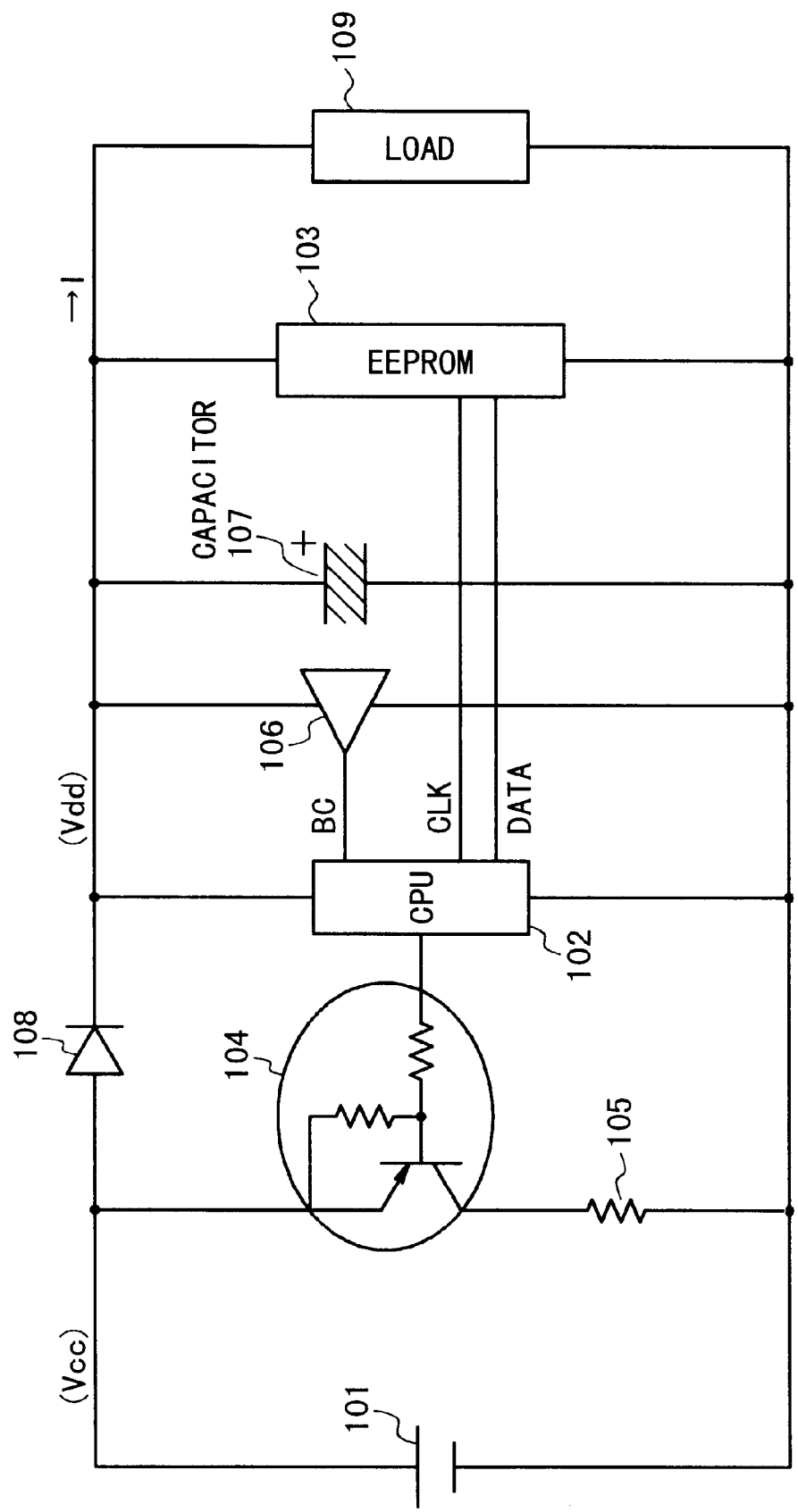
FIG. 1 is a diagram illustrating a battery voltage detecting system for a wireless portable information terminal apparatus in a first conventional example.

Next, a portable information terminal apparatus of the present invention will be described in detail with reference to the drawings, taking a wireless portable information terminal apparatus as an example. It should be noted that components having the same reference numerals have the same functions in the following description.

Figure 2:
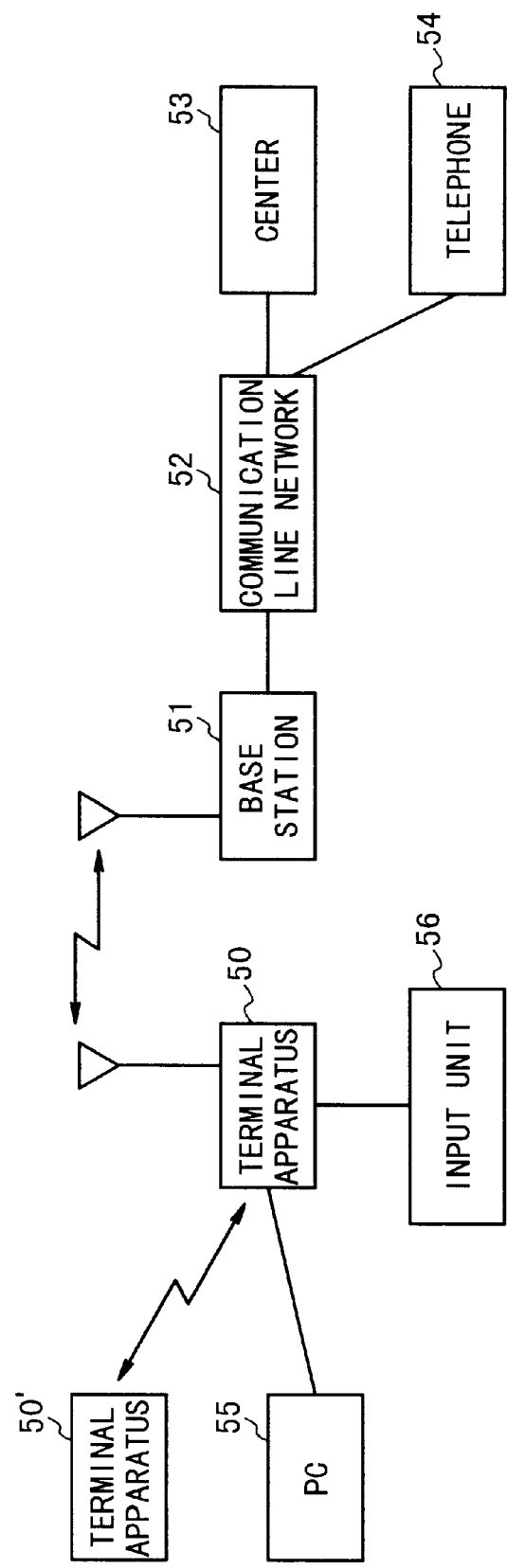
FIG. 2 is a block diagram illustrating a use example of a wireless portable information terminal apparatus of the present invention.

First, the wireless portable information terminal apparatus according to the first embodiment of the present invention will be described in detail. FIG. 2 is a diagram illustrating a use example of the wireless portable information terminal apparatus of the present invention. Referring to FIG. 2, the wireless portable information terminal apparatus 50 transmits and receives data to and from a service centers 53 through a base station 51 and a communication line network 52, and performs telephone communication through the base station 51 and the communication line network 52. Also, the wireless portable information terminal apparatus 50 transmits and receives data to and from another terminal apparatus 50' with a wire/wireless signal. Further, the wireless portable information terminal apparatus 50 processes information such as address and schedule inputted from an input unit 56, a personal computer (PC) 55 and a keyboard.

Next, the structure of the wireless portable information terminal apparatus according to the first embodiment of the present invention will be described with reference to FIG. 4.

Figure 4:
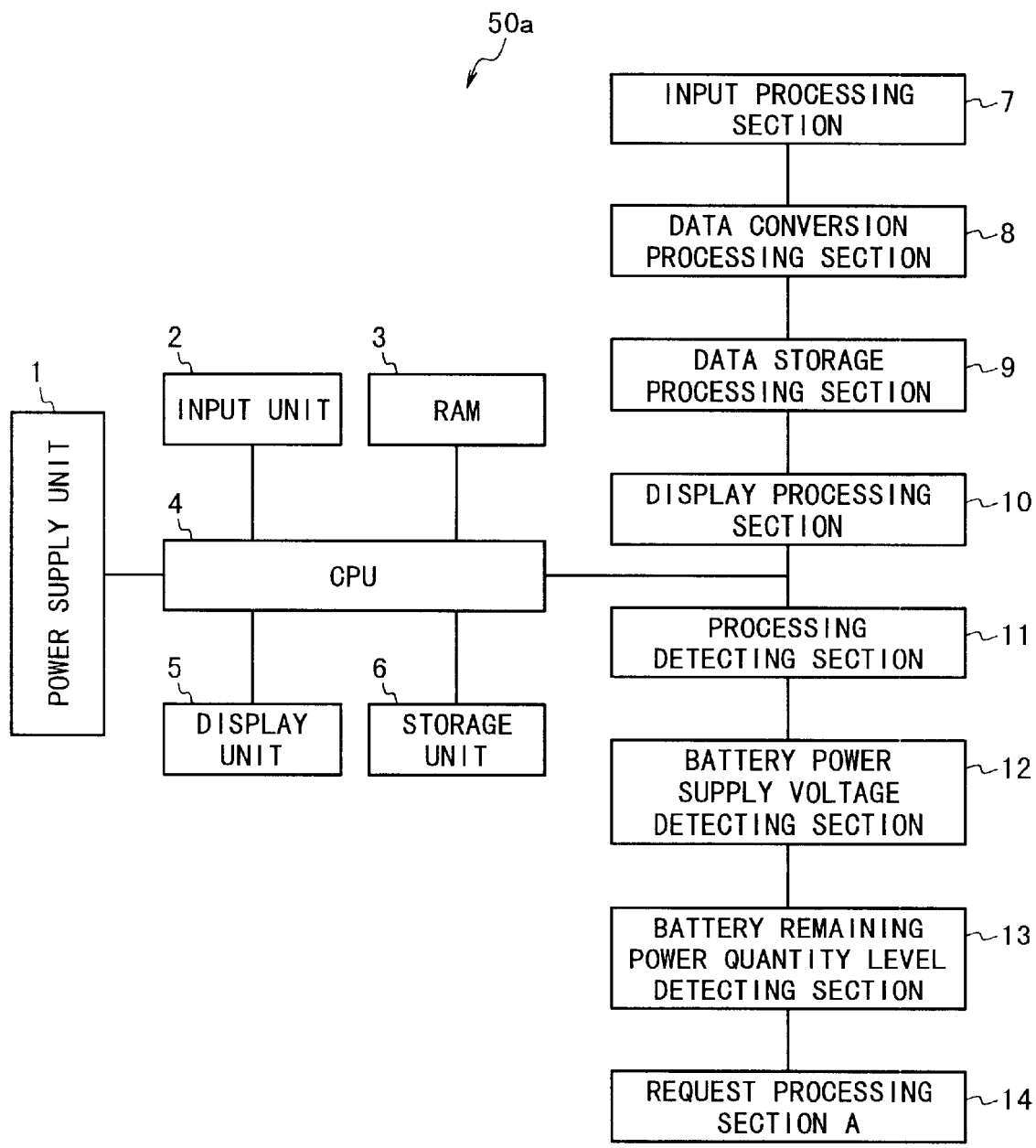
FIG. 4 is a block diagram illustrating the structure of the wireless portable information terminal apparatus according to the first embodiment of the present invention.

Referring to FIG. 4, the wireless portable terminal apparatus 50a is composed of a power supply unit 1, an input unit 2, a random access memory (RAM) 3, a central processing unit (CPU) 4, a display unit 5, a storage unit 6, an input processing section 7, a data conversion processing section 8, a data storage processing section 9, a display processing section 10, a processing detecting section 11, a power supply voltage detecting section 12, a remaining power quantity detecting section 13 and a request processing section A 14.

In this case, the input processing section 7, the data conversion processing section 8, the data storage processing section 9, the display processing section 10, the processing detecting section 11, the power supply voltage detecting section 12, the remaining power quantity detecting section 13, and the request processing section A 14 are illustrated to be connected in series. However, the wireless portable information terminal apparatus 50a has the structure in which they are connected to a common data line or a bus line in actual, and they are connected to each other.

Figure 3:
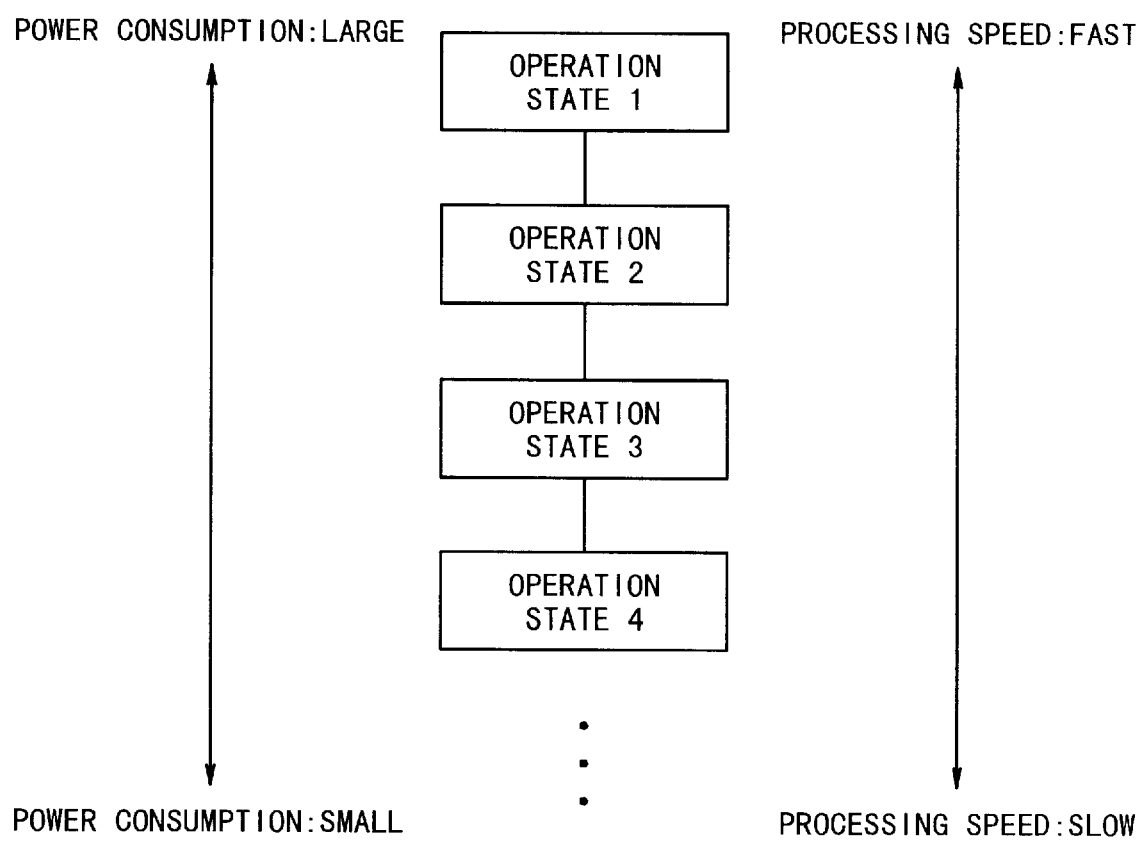
FIG. 3 is a concept diagram of the operation state of the wireless portable information terminal apparatus of FIG. 2.

FIG. 3 is a diagram illustrating an example of the operation state of the wireless portable information terminal apparatus 50a according to the first embodiment of the present invention. As shown in FIG. 3, the wireless portable information terminal apparatus 50a has "operation states 1, 2, 3 and 4", in which power consumption quantities are different from each other.

When the wireless portable information terminal apparatus 50a is in an "operation state 1", the power consumption quantity is the largest but the processing speed of the wireless portable information terminal apparatus is the fastest.

On the other hand, when the wireless portable information terminal apparatus is in an "operation state 4", the power consumption quantity is the smallest but the processing speed of the wireless portable information terminal apparatus is the slowest. An "operations state 2" and an "operation state 3" are the intermediate state between the operation state 1 and the operation state 4.

In this way, the operation states of the terminal apparatus 50a can be switched in accordance with a quantity to be processed in the wireless portable information terminal apparatus 50a.

More specifically, the operation states of the wireless portable radio information terminal apparatus in the first embodiment are classified as shown in the following table 1.

TABLE 1

| State No. | Actual operation state | power Consumption |
|---|---|---|
| Operation state 1 | Clock signal is supplied to CPU and peripheral circuits. Clock rate is the fastest. | largest |
| Operation state 2 | Clock signal has a clock rate of 1/4 to 1/32 of that of operation state 1. | large |
| Operation state 3 | Supply of clock signal to CPU is stopped. | less |
| Operation state 4 | Supply of clock signal and power to all peripheral circuits. | least |

In the above table 1, the clock signal supplied to the CPU 4 has the fastest clock rate in the operation state 1 and the clock signal is supplied to all the peripheral circuit associated with the terminal apparatus.

Also, in the operation state 2, the clock signal is slow-downed, and the clock signal has the clock rate of 1/4 to 1/32 of that of the clock signal in the operation state 1.

Also, the operation state 3 is the state in which the supply of the clock signal to the CPU 4 and the peripheral circuit being not used is stopped.

Further, the operation state 4 is the state in which the supply of the clock signal to all the peripheral circuits other than a RTC (real time clock) timer is stopped, and the display unit 5 is turned OFF, and the RAM 3 is set to a self-refreshment mode.

Figure 7:
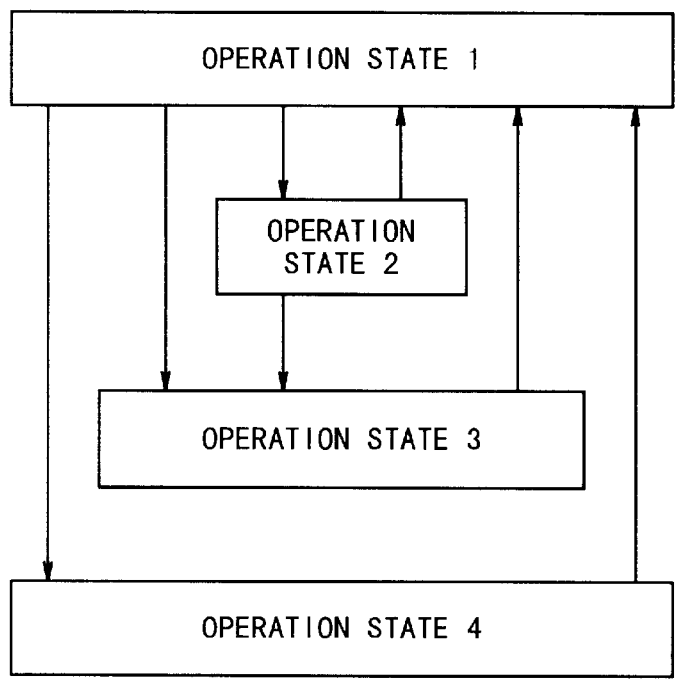
FIG. 7 is a diagram used to explain the transition of the operation state of the wireless portable information terminal apparatus according to the first embodiment of the present invention.

Next, an example of transition concept of the operation state used in the first embodiment of the present invention will be described with reference to FIG. 7. Referring to FIG. 7, the initial operation state is set to the operation state 1 when the power supply 1 is turned ON. First, the timer is set. The timer can be cleared by an input from the user. In the operation state 1, when the communication state should be not hindered with noise due to the clock signal, an instruction is issued to the CPU 4 to switch the operation state to the operation state 2.

Also, when there is no processing to be performed by the CPU 4 in the operation state 1 or operation state 2, an instruction is issued to the CPU 4 to switch the operation state to the operation state 3. When an interrupt is generated by the above timer, whether or not there is any processing which should be performed by the CPU 4 is determined. When there is no processing which should be performed by the CPU 4, an instruction is issued to the CPU 4 to switch the operation state to the operation state 3.

When the user performs an input from a pen or a keyboard or when an interrupt is generated to the CPU 4 from the above timer, the CPU 4 is automatically switched to the operation state 1.

Next, various sections of the wireless portable information terminal apparatus will be described.

The input processing section 7 receives data inputted from the input unit 2 such as a pen and a keyboard. The data conversion processing section 8 converts the format of the inputted data into the format suitable for programs for an address book, a scheduler and so on. The data storage processing section 9 stores the data which has been produced by the program or the received data in the storage unit 6. The display processing section 10 displays a program and data on the display unit 5. The storage unit 6 stores the program and data and also stores a discharge quantity table. The discharge quantity table may be stored in the RAM 3.

The processing detecting section 11 detects the existence or non-existence of the processing in each of the processing sections and the content of the processing which is being performed in each processing section when the processing is being performed. Also, the processing detecting section 11 requests switching of the operation state to the CPU based on the detection result, notifies to the remaining power quantity level detecting section that the operation state is switched. Further, the processing detecting section 11 keeps an operation state constant in the detection of the power supply voltage.

The CPU 4 switches the operation state in response to an instruction from the processing detecting section 11. The power supply voltage detecting section 12 detects the power supply voltage which is used for the terminal apparatus. The remaining power quantity level detecting section 13 detects a remaining power quantity from the power supply voltage detected by the power supply voltage detecting section 12 and a discharge quantity table. The discharge quantity table stores remaining power quantities respectively corresponding to the operation states and the power supply voltages. The detected remaining power quantity is displayed on the display unit 5 by the display processing section 10.

The request processing section A 14 requests the power supply voltage detection for every predetermined time period, and notifies to the processing detecting section 11 that power supply voltage is being detected.

Each of the above processing sections and units is controlled through the RAM 3 and the CPU 4.

Figure 5:
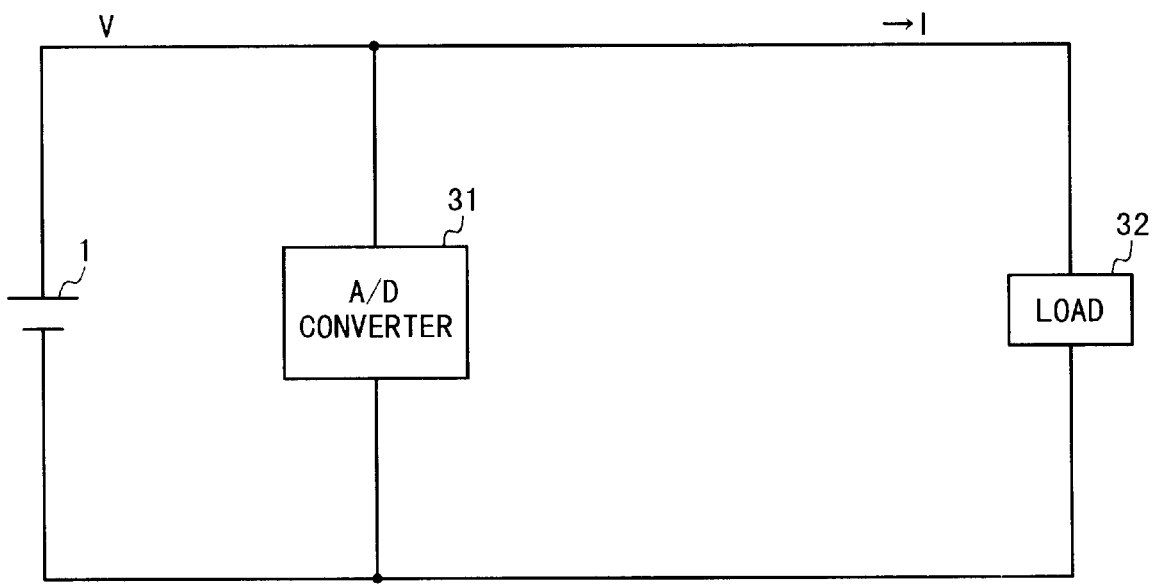
FIG. 5 is a diagram illustrating the battery voltage detecting section in the wireless portable information terminal apparatus according to the first embodiment of the present invention.

FIG. 5 is a diagram illustrating the concept of the power supply voltage detection in the first embodiment of the present invention. As shown in FIG. 5, the state of the load 32 which contains the CPU and the EEPROM are fixed in the detection of the battery voltage so as to correctly detect the power supply voltage value by the A/D converter 31. Also, the dummy load 105 as shown in the conventional example is not used.

Figure 6:
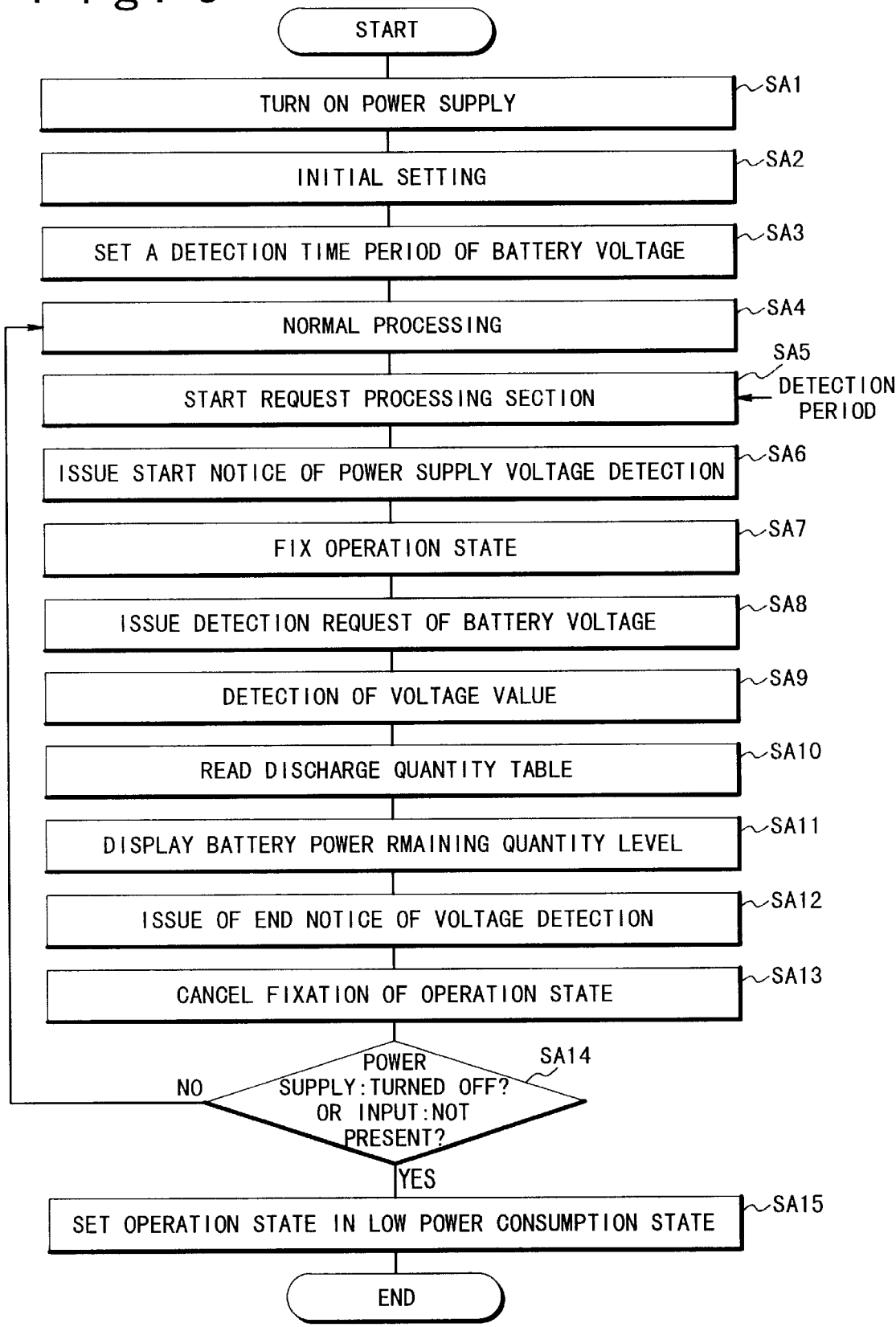
FIG. 6 is a flow chart used to explain the operation of the wireless portable information terminal apparatus according to the first embodiment of the present invention.

Next, the operation of the wireless portable information terminal apparatus 50a of FIG. 4 will be described. FIG. 6 is a flow chart illustrating the operation procedure of the wireless portable information terminal apparatus according to the first embodiment of the present invention.

As shown in FIG. 6, when the power supply unit 1 of the terminal apparatus 50a is turned ON by the user (step SA1), the operating system (OS) which has been stored in the storage unit 6 is developed on the RAM 3 to perform the operation confirmation and the initialization of the terminal apparatus 50a (step SA2).

Then, the request processing section A 14 sets a timer to be started at a predetermined time period at which the battery voltage is detected (step SA3).

An application program is started, and the display processing section 10 displays the screen of the application on the display unit 5 to wait for any input from the user. If there is an input, the control enters a normal processing state, in which the input processing section 7, the data conversion processing section 8 and the data storage processing section 9 are used (step SA4).

In this state, the processing detecting section 11 detects the content of the processing which is being performed in each processing section and the existence or non-existence of the processing. The processing detecting section 11 requests the switching of the operation state to the CPU 4 based on the detection result. When the CPU 4 switches the operation state, the processing detecting section 11 notifies to the remaining power quantity level detecting section 13 that the operation state is switched (step SA5).

When an interrupt is generated at the time period set as mentioned above, the request processing section A 14 issues a start notice of the power supply voltage detection to the processing detecting section 11 (step SA6). At this time, when receiving the start notice, the processing detecting section 11 controls the CPU 4 to fix the current operation state without issuing the instruction to request the switching of the operation state to the CPU 4 (step SA7).

Also, after issuing the start notice, the request processing section A 14 issues the detection request of the battery voltage to the power supply voltage detecting section 12 (step SA8). The power supply voltage detecting section 12 detects the battery voltage in response to the detection request of the battery voltage (step SA9). When the battery voltage detection is ended, the power supply voltage detecting section 12 notifies to the processing detecting section 11 that the detection of the power supply voltage is ended.

The remaining power quantity level detecting section 13 refers to the discharge quantity table based on the current operation state and the detected voltage value to detect a remaining power quantity level (step SA10). The detected remaining power quantity level is displayed on the display unit 5 by the display processing section 10 (step SA11).

When receiving a detection end notice from the power supply voltage detecting section 12 (step SA12), the processing detecting section 11 controls the CPU 4 to cancel the fixation of the operation state. As a result, the control returns to the normal processing state (step SA13).

The processing detecting section 11 determines whether a user turns OFF the power supply unit 1 of the portable information terminal apparatus 50a and whether there is no input from the user for a predetermined time (step SA14). When the answer is affirmative, the processing detecting section 11 issues an operation state switching request to the CPU 4 such that the portable information terminal apparatus 50a is transited to the operation state 4 with the smallest power consumption quantity (step SA15). Even in this state, when the timer counts the predetermined time period, the request processing section A 14 is automatically started to repeat the above-mentioned processing to detect the power supply voltage.

The following table 2 shows an example of the discharge quantity table used in the wireless portable wireless information terminal apparatus according to the first embodiment of the present invention. The remaining power quantity level is determined based on the operation state (operation mode) and the detected voltage value. In this example, five remaining power quantity levels are used. However, another number of levels may be used.

Figure 8:
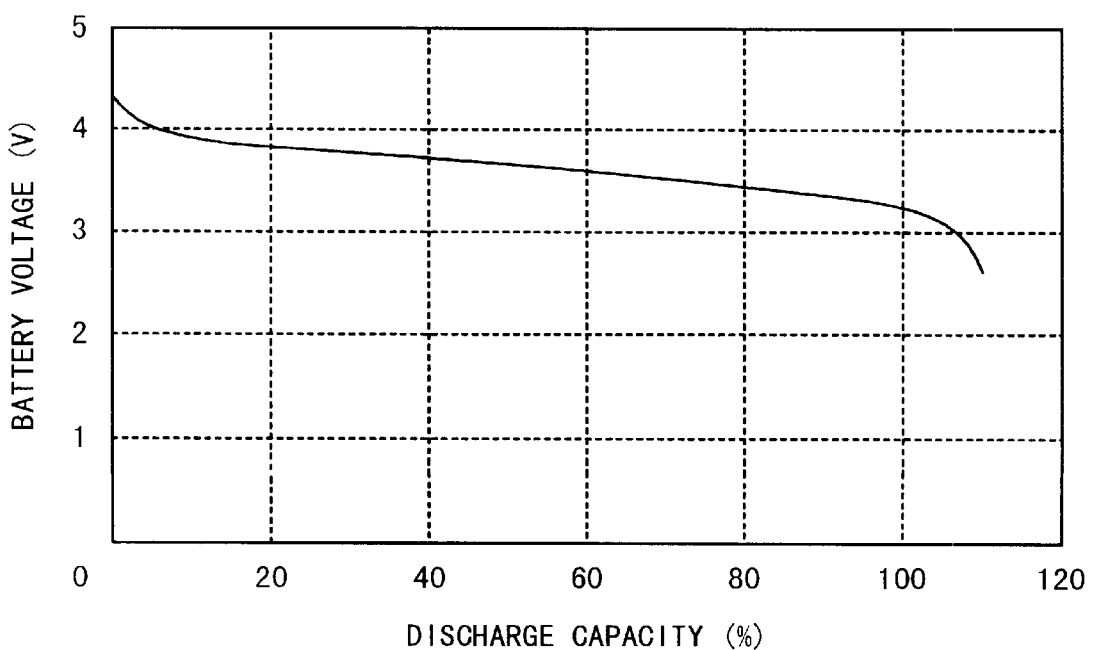
FIG. 8 is a diagram illustrating the discharge characteristic of the battery used in the wireless portable information terminal apparatus.

In the example of the battery discharge characteristic shown in FIG. 8, a level 5 indicates a discharge quantity of 0 to 20%, a level 4 indicates a discharge quantity of 20 to 40%, a level 3 indicates a discharge quantity of 40 to 60%, a level 2 indicates a discharge quantity of 60 to 80%, and a level 1 indicates a discharge quantity of 80 to 100%. The discharge quantity indicates how much power quantity has been used from the initial full power quantity of the battery.

TABLE 2

| Mode/volt | 4.9 to 3.9 | 3.9 to 3.8 | 3.8 to 3.7 | 3.7 to 3.6 | 3.6 to 3.5 | 3.5 to 3.4 | 3.4 to 3.3 | 3.3 to 3.2 | 3.2 to 3.1 | 3.1 to 3.0 |
|---|---|---|---|---|---|---|---|---|---|---|
| Operation State 1 | 5 | 5 | 5 | 5 | 5 | 4 | 4 | 3 | 2 | 1 |
| Operation State 2 | 5 | 5 | 5 | 5 | 4 | 4 | 3 | 3 | 2 | 1 |
| Operation State 3 | 5 | 5 | 5 | 4 | 4 | 3 | 3 | 2 | 2 | 1 |
| Operation State 4 | 5 | 5 | 4 | 4 | 4 | 3 | 3 | 2 | 2 | 1 |

Next, the wireless portable information terminal apparatus according to the second embodiment of the present invention will be described in detail with reference to the drawings.

Figure 9:
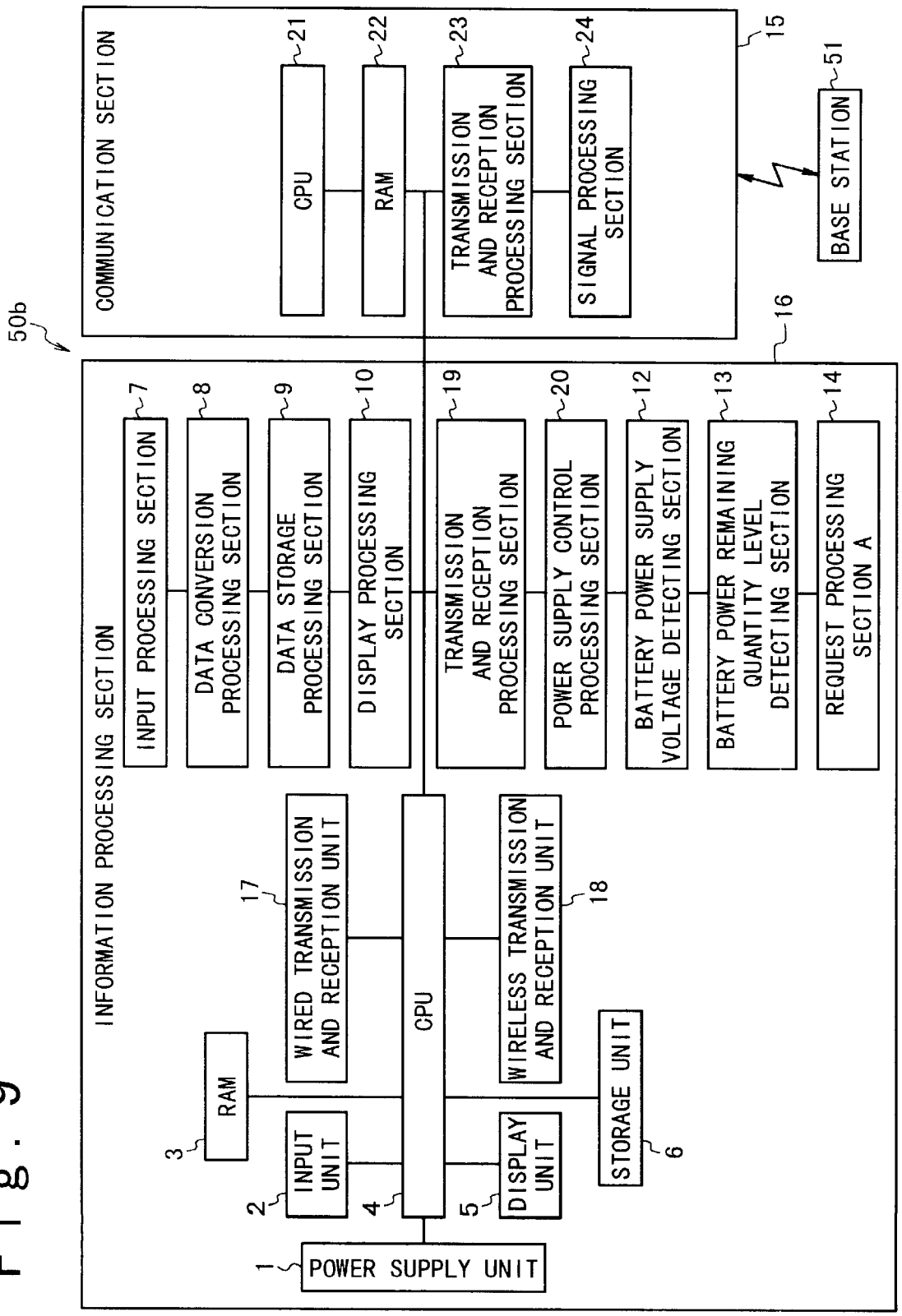
FIG. 9 is a block diagram illustrating the structure of the wireless portable information terminal apparatus according to a second embodiment of the present invention.

FIG. 9 is a block diagram illustrating the structure of the wireless portable information terminal apparatus in the second embodiment. The wireless portable information terminal apparatus contains the features of the wireless portable information terminal apparatus shown in FIG. 4 but the wireless portable information terminal apparatus does not have the operation states shown in FIG. 3.

Referring to FIG. 9, the terminal apparatus 50b in the second embodiment is mainly divided into a communication control section 15 and a processing section 16. The communication control section 15 communicates with a base station 51 with a wireless signal. The processing section 16 is equipped with data transmitting and receiving section for transmitting and receiving data to and from another terminal apparatus.

The wireless portable terminal section 15 is composed of transmission and reception processing section 23 for transmitting and receiving a signal, and a signal processing section 24 for converting the received signal into a data and the data to be transmitted into the signal. The wireless portable terminal section 15 performs the processing through the CPU 21 and the RAM 22.

The processing section 15 of the terminal apparatus 50b is composed of a power supply unit 1, an input unit 2, a random access memory (RAM) 3, a central processing unit (CPU) 4, a display unit 5, a storage unit 6, an input processing section 7, a data conversion processing section 8, a data storage processing section 9, a display processing section 10, a power supply voltage detecting section 12, a remaining power quantity level detecting section 13, a request processing section A 14, a wire transmission and reception unit 17, a wireless transmission and reception unit 18, a transmission and reception processing 19, and a power supply control processing unit 20.

In this case, the input processing section 7, the data conversion processing section 8, the data storage processing section 9, the display processing section 10, the processing detecting section 11, the power supply voltage detecting section 12, the remaining power quantity level detecting section 13, and the request processing section A 14 are illustrated to be connected in series. However, the terminal apparatus 15 has the structure in which they are connected to a common data line and bus line in actual, and they are connected to each other.

Here, the power supply unit 1 is composed of a portable power supply such as a battery. Also, the input processing section 7 receives data inputted from the input unit 2 such as a pen and a keyboard. The data conversion processing section 8 converts the format of the inputted data into the format in which programs for an address book, a scheduler and so on can receive.

The data storage processing section 9 stores the data which has been produced on the program or received data in the storage unit 6, which maintains data actually, and especially stores the discharge quantity table. The display processing section 10 displays a program and data on the display unit 5.

The transmission and reception processing section 19 transmits a produced data and a maintained data to another terminal apparatus and receives a data from another terminal apparatus. The wired data transmission and reception apparatus 17 transmits and receives data actually.

The power supply control processing section 20 controls ON/OFF of the power supply to be supplied to the various units and the circuits concerning with the units (hereinafter, to be referred to as peripheral circuits). Also, the power supply control processing section 20 notifies that ON/OFF of the above power supply is switched, to the remaining power quantity level detecting section 13.

The power supply voltage detecting section 12 detects a power supply voltage, and notifies that the detection of the power supply voltage has been ended, to the request processing section A 14.

The remaining power quantity level detecting section 13 refers to the discharge quantity table based on the switching ON/OFF of power supply to each peripheral circuit and the detected power supply voltage to detect a remaining power quantity level. Also, the detected remaining power quantity level is displayed on the display unit 5 by the display processing section 10.

In this manner, in the second embodiment, the discharge quantity table stores the remaining power quantity levels for combinations of the switching ON/OFF of power supply to each peripheral circuit and the detected power supply voltage. That is, the above table 2 has the structure in which the switching ON/OFF of power supply to each peripheral circuit is used in place of the operation state.

The request processing section A 14 requests the power supply voltage detection for every predetermined time period.

Each of the above processing sections and units is controlled through the RAM 3 and the CPU 4.

Figure 10:
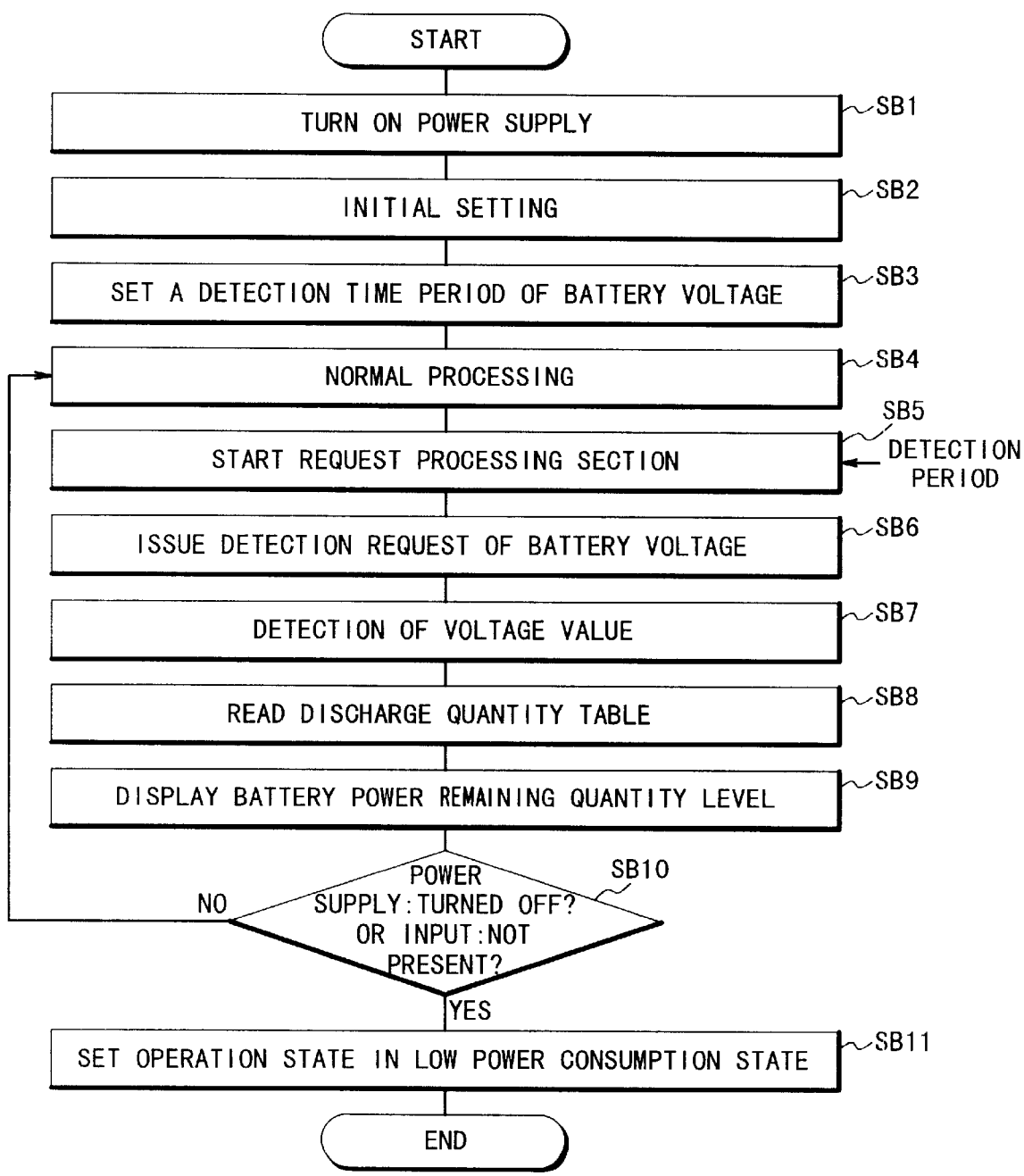
FIG. 10 is a flow chart used to explain the operation of the wireless portable information terminal apparatus according to the second embodiment of the present invention.

Next, the operation of the wireless portable information terminal apparatus of FIG. 9 will be described. FIG. 10 is a flow chart illustrating the operation procedure of the wireless portable information terminal apparatus 50b according to the second embodiment of the present invention.

Referring to FIG. 10, when the power supply unit 1 of the terminal apparatus 50b is turned ON by the user (step SB1), the operating system (OS) which has been stored in the storage unit 6 is developed on the RAM 3 to perform the operation confirmation and the initialization of the terminal apparatus (step SB2).

The request processing section A 14 sets a timer to be started at a predetermined time period at which the battery voltage is detected (step SB3).

An application program is started, and the display processing section 10 displays the screen of the application on the display unit 5 to wait for any input from the user. If there is the input, the control enters a normal processing state in which processing is performed by the input processing section 7, the data conversion processing section 8 and the data storage processing section 9 (step SB4).

In this state, the power supply control processing section 20 controls supply of power from the power supply unit 1 to each peripheral circuit. When ON/OFF of the above power supply is switched, the power supply control processing section 20 notifies that the power supply is switched, to the remaining power quantity level detecting section 13.

When being started at the time period set as mentioned above (step SB5), the request processing section A 14 issues the power supply voltage detection request to the processing detecting section 12 (step SB6). The power supply voltage detecting section 12 detects a voltage value when receiving the power supply voltage detection request (step SB7).

The remaining power quantity level detecting section 13 refers to the discharge quantity table based on the existence or non-existence of each of the operations of the peripheral circuits and the detected power supply voltage to detect a remaining power quantity level (step SB8). The detected remaining power quantity level is displayed on the display unit 5 (step SB9). Then, the control returns to the normal processing state.

When the user turns OFF the power supply unit 1 of the portable information terminal apparatus 50b or there is no input from the user for a predetermined time, the CPU 4 controls the whole of portable information terminal apparatus to transit to the operation state with the smallest power consumption quantity (step SB10). Even in this state, when the time reaches the timing of the power supply voltage detection, the request processing section A 14 is automatically started to issue the detection request to the battery power supply voltage detecting section 12. The battery voltage detecting section 12 repeats the processing which detects a power supply voltage (step SB11).

Figure 11:
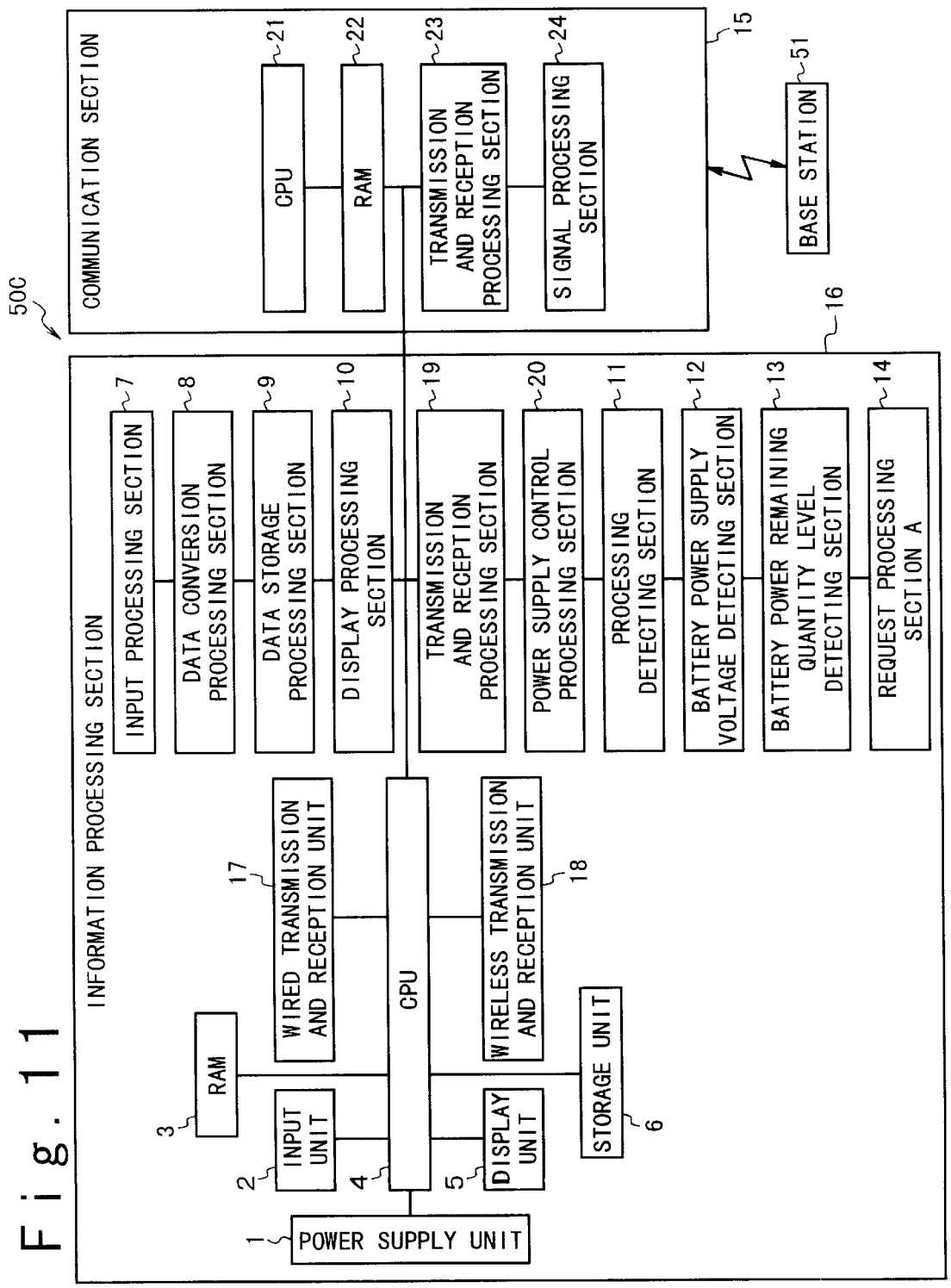
FIG. 11 is a block diagram illustrating the structure of the wireless portable information terminal apparatus according to a third embodiment of the present invention.

Next, the wireless portable information terminal apparatus according to the third embodiment of the present invention will be described below in detail with reference to the drawings. FIG. 11 is a block diagram illustrating the structure of the wireless portable information terminal apparatus according to the third embodiment of the present invention. In the third embodiment, all the features of the wireless portable information terminal apparatus in the first embodiment are contained, and the operation states shown in FIG. 3 are achieved.

The terminal apparatus 50c can be mainly divided into a communication section 15 and an information processing section 25. The communication section 15 transmits and receives a wireless signal to and from a base station 51, and the information processing section 25 receives an input from the user to process the input, stores the processed data, and transmits and receives data to and from another terminal apparatus.

The communication section 15 is composed of a transmission and reception processing section 23 which transmits and receives a signal, and a signal processing section 25 which converts the received signal into a data and the data to be transmitted into a signal. The communication section 15 performs the processing through the CPU 21 and the RAM 22.

The information processing section 25 is composed of a power supply unit 1, an input unit 2, a random access memory (RAM) 3, a central processing unit (CPU) 4, a display unit 5, a storage unit 6, an input processing section 7, a data conversion processing section 8, a data storage processing section 9, a display processing section 10, a processing detecting section 11, a power supply voltage detecting section 12, a remaining power quantity level detecting section 13, a request processing section A 14, a wired transmission and reception unit 17, a wireless transmission and reception unit 18, a transmission and reception processing 19, and a power supply control processing unit 20. Here, the power supply unit 1 is composed of a portable power supply such as a battery.

In this case, the input processing section 7, the data conversion processing section 8, the data storage processing section 9, the display processing section 10, the processing detecting section 11, the power supply voltage detecting section 12, the remaining power quantity level detecting section 13, the request processing section A 14, the transmission and reception processing 19, and the power supply control processing unit 20 are illustrated to be connected in series. However, the terminal apparatus 15 has the structure in which they are connected to a common data line and bus line in actual, and they are connected to each other.

The input processing section 7 receives data inputted from the input unit 2 such as a pen and a keyboard. The data conversion processing section 8 converts the inputted data into the data which programs for an address book, a scheduler and so on can receive. The data storage processing section 9 stores the data which has been produced on the program or received data in the storage unit 6. The display processing section 10 displays a program and data on the display unit 5.

The transmission and reception processing section 19 transmits a produced data and a maintained data to another terminal apparatus and receives a data from another terminal apparatus. The wired data transmission and reception unit 17 transmits and receives data actually.

The power supply control processing section 20 controls ON/OFF of the power supply to be supplied to the peripheral circuits, and notifies that ON/OFF of the above power supply is switched, to the remaining power quantity level detecting section 13.

The processing detecting section 11 detects the content of the processing which is performed in each of the processing sections and requests the switching of the operation state to the CPU 4 based on the detection result. Also, the processing detecting section 11 notifies to the remaining power quantity level detecting section 13 that the operation state is switched, and issues a lock instruction to the CPU 4 to keep an operation state constant in the detection of the power supply voltage. The CPU 4 switches the operation state in response to the switching request from the processing detecting section 11.

The power supply voltage detecting section 12 detects the power supply voltage and notifies that the detection of the power supply voltage has been ended, to the request processing section A 14.

The remaining power quantity level detecting section 13 refers to a discharge quantity table based on the detected power supply voltage value, the switching ON/OFF of the power supply to be supplied to the peripheral circuits, and the operation state to detect a remaining power quantity level. The detected the remaining power quantity level is displayed on the display unit 5.

The request processing section A 14 requests the power supply voltage detection at every predetermined time period.

These processing sections and units are controlled through the CPU 4 and the RAM 3.

Next, the operation of the wireless portable information terminal apparatus according to the third embodiment of the present invention will be described according to a flow chart of FIG. 6 and with reference to the structure diagram of FIG. 11. Referring to FIG. 11, when the power supply 1 of the terminal apparatus 50*c* is turned ON by the user (step SA1), an operating system (OS) which has been stored in the storage unit 6 is developed on the RAM 3 to perform the operation confirmation and the initialization of the terminal apparatus (step SB2).

The request processing section A 14 sets a timer to be started at a time period at which the battery voltage is detected (step SA3).

An application program is started, and the display processing section 10 displays the screen of the application on the display unit 5 to wait for any input from the user. If there is the input, the control enters a normal processing state in which processing is performed by the input processing section 7, the data conversion processing section 8 and the data storage processing section 9 (Step SB4).

In this state, the processing detecting section 11 detects the content of the processing which is performed in each processing section and the existence or non-existence of the processing. The processing detecting section 11 requests the switching of the operation state to the CPU 4 based on the detection result. When the CPU 4 switches the operation state, the processing detecting section 11 notifies to the remaining power quantity level detecting section 13 that the operation state is switched. Also, the power supply control processing section 20 controls ON/OFF of the power supply to be supplied to the peripheral circuits. Also, when ON/OFF of the above power supply is switched, the power supply control processing section 20 notifies to the remaining power quantity level detecting section 13 that ON/OFF of the above power supply is switched.

When being started at the time period set as mentioned above, the request processing section A 14 issues a start notice of the power supply voltage detection to the processing detecting section 11 (step SA6). When receiving the start notice of the power supply voltage detection, the processing detecting section 11 does not issue an instruction for switching the operation state to the CPU 4 and controls the CPU 4 to fix the current operation state (step SA7).

Further, the request processing section A 14 issues a detection request of the battery voltage to the power supply voltage detecting section 12 when the operation state is fixed after the notice is issued (step SA8).

The power supply voltage detecting section 12 detects a voltage value when receiving the detection request of the battery voltage (step SA9), and notifies to the processing detecting section 11 that the detection of the power supply voltage is ended, when the detection of the power supply voltage ends.

The remaining power quantity level detecting section 13 refers to the discharge quantity table based on the operation state, the existence or non-existence of the operation of the peripheral circuits and the detected voltage value (step SA10) to detect a remaining power quantity level (step SA11). The detected remaining power quantity level is displayed on the display unit 5 by the display processing section 10.

When receiving a detection end notice from the power supply voltage detecting section 12 (step SA12), the processing detecting section 11 controls the CPU 4 to cancel the fixation of the operation state (step SA13). Then, the control returns to the normal processing state.

When a user turns OFF the power supply 1 of the portable information terminal apparatus or there is no input from the user for a predetermined time (step SA14), the processing detecting section 11 issues an operation state switching request to the CPU 4. As a result, the portable information terminal apparatus is transited to the operation state with the smallest power consumption quantity (step SA15).

Even in this state, the request processing section A 14 is automatically started when the time reaches a detection time of the power supply voltage detection. The power supply voltage detecting section 12 repeats the processing to detect a power supply voltage.

Figure 12:
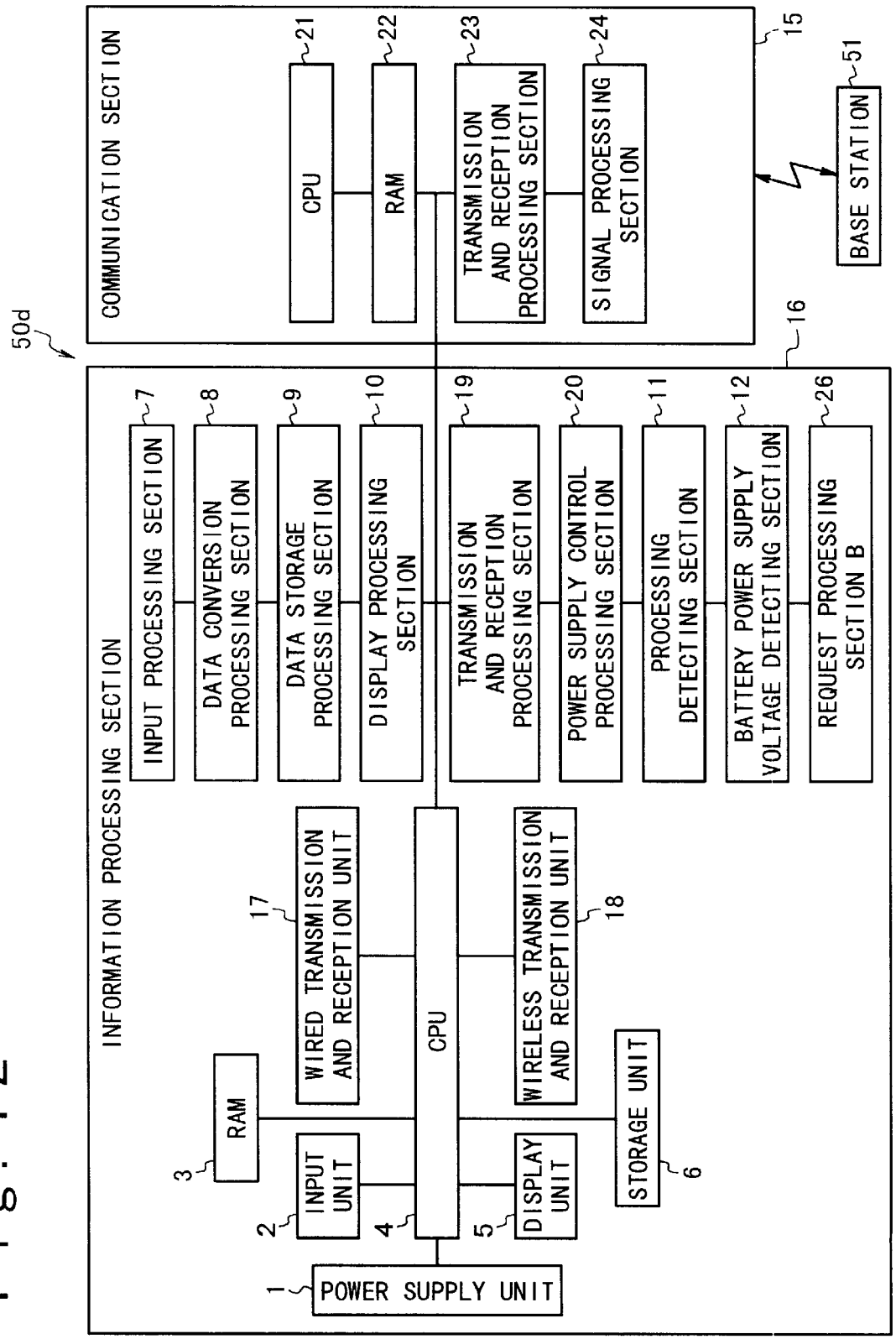
FIG. 12 is a block diagram illustrating the structure of the wireless portable information terminal apparatus according to a fourth embodiment of the present invention.

Next, the wireless portable information terminal apparatus according to the fourth embodiment of the present invention will be described in detail. FIG. 12 is a block diagram illustrating the structure of the wireless portable information terminal apparatus 50d according to the fourth embodiment of the present invention. In the fourth embodiment, a function to detect a remaining power quantity level from the detection result of the power supply voltage is provided for the request processing section in the third embodiment.

Referring to FIG. 12, the terminal apparatus 50d can be mainly divided into a communication section 15 for transmitting and receiving a wireless signal to and from a base station 51, and an information processing section 16 for receiving an input from the user to process the input, storing the processed data, and transmitting and receiving data to and from another terminal apparatus.

The communication section 15 is composed of transmission and reception processing section 23 for transmitting and receiving a signal, and a signal processing section 24 for converting the received signal into a data and the data to be transmitted into a signal. The communication section, 15 performs the processing through the CPU 21 and the RAM 22.

The information processing section 16 is composed of a power supply unit 1 such as a battery having portability, an input unit 2 such as a pen and a keyboard, a random access memory (RAM) 3, a central processing unit (CPU) 4, a display unit 5, a storage unit 6, an input processing section 7, a data conversion processing section 8, a data storage processing section 9, a display processing section 10, a processing detecting section 11, a power supply voltage detecting section 12, a wire transmission and reception unit 17, a wireless transmission and reception unit 18, a transmission and reception processing 19, a power supply control processing unit 20, and a request processing section B 26.

In this case, the input processing section 7, the data conversion processing section 8, the data storage processing section 9, the display processing section 10, the processing detecting section 11, the power supply voltage detecting section 12, the transmission and reception processing 19, the power supply control processing unit 20, and the request processing section B 26 are illustrated to be connected in series. However, the terminal apparatus 15 has the structure in which they are connected to a common data line and bus line in actual, and they are connected to each other.

The input processing section 7 receives data inputted from the input unit 2 such as a pen and a keyboard. The data conversion processing section 8 converts the inputted data into the data which programs for an address book, a scheduler and so on can receive. The data storage processing section 9 stores the data which has been produced on the program or received data.

The data storage processing section 9 stores data in the storage unit 6. The display processing section 10 display a program and data on the display unit 5. The display processing section 10 displays the remaining power quantity level on the display unit 5.

The transmission and reception processing section 19 transmits a produced data and a maintained data to another terminal apparatus and receives a data from another terminal apparatus.

The wire transmission and reception unit 17 actually transmits and receives data through the wired line. The wireless transmission and reception unit 18 actually transmits and receives data through a wireless channel.

The power supply control processing section 20 controls ON/OFF of the power supply to be supplied to the peripheral circuits, and notifies that ON/OFF of the above power supply is switched, to the processing detecting section 11.

The processing detecting section 11 detects the content of the processing which is performed in each of the processing sections and the existence or non-existence of the processing, operation state, and requests the switching of the operation state to the CPU 4 based on the detection result. The processing detecting section 11 does not issue an operation state switching request to the CPU 4 and keeps an operation state constant in the detection of the power supply voltage. Further, the processing detecting section 11 detects the remaining power quantity level from a plurality of discharge quantity tables based on the detecting result of the power supply voltage.

The CPU 4 switches the operation state in response to the operation state switching request from the processing detecting section 11.

The power supply voltage detecting section 12 detects a power supply voltage, and notifies that the detection of the power supply voltage has been ended, to the request processing section A 14.

The request processing section B 26 requests the power supply voltage detection at every predetermined time period.

These processing sections and units are controlled through the CPU 4 and the RAM 3.

Figure 13:
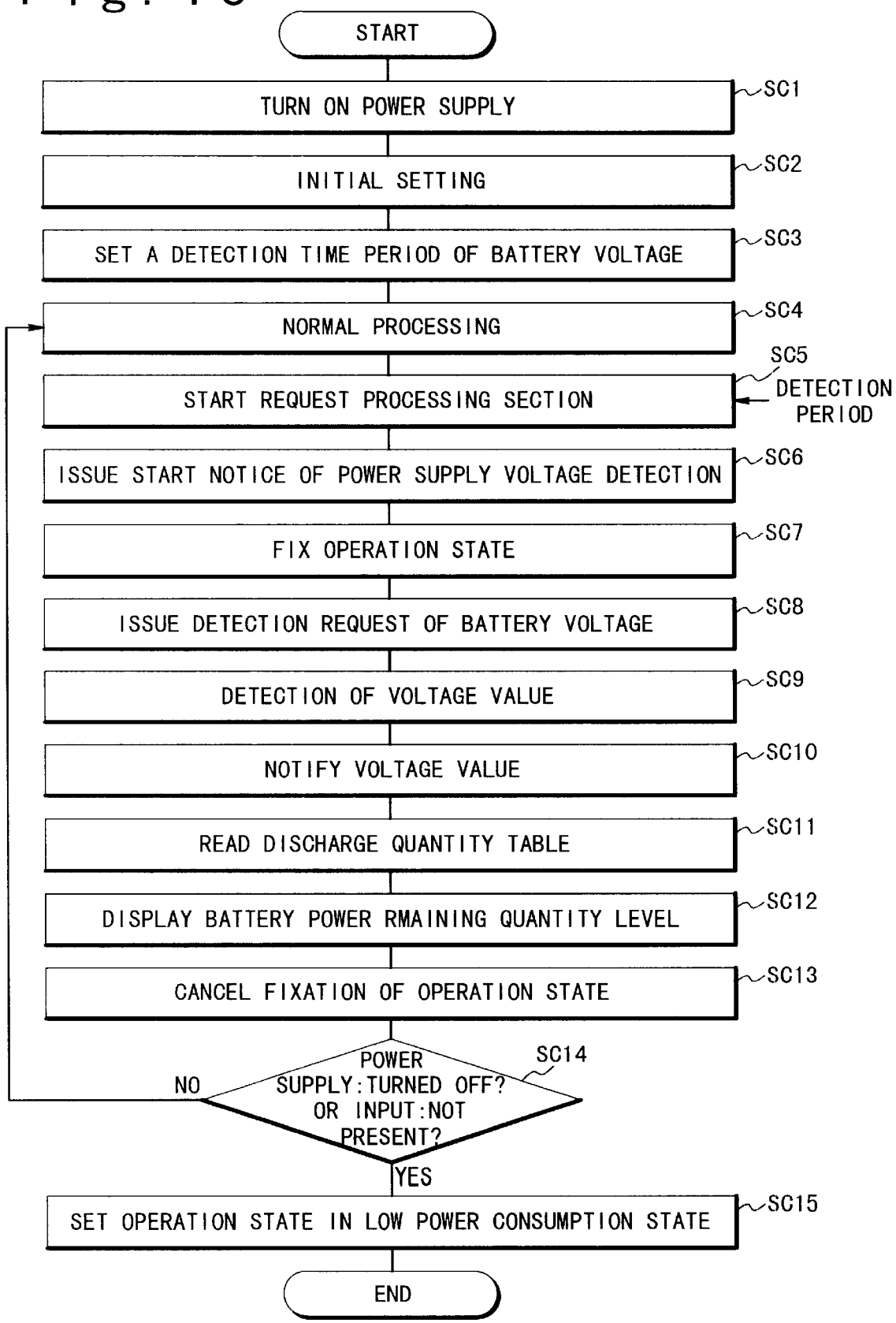
FIG. 13 is a flow chart used to explain the operation of the wireless portable information terminal apparatus according to the fourth embodiment of the present invention.

Next, the operation of the wireless portable information terminal apparatus according to the fourth embodiment of the present invention will be described. FIG. 13 is a flow chart illustrating the operation procedure of the wireless portable receiving terminal apparatus according to the fourth embodiment of the present invention. The operation of the wireless portable information terminal apparatus will be described in accordance with the flow chart with reference to the structure diagram of FIG. 12.

Referring to FIG. 13, when the power supply 1 of the terminal apparatus 50d is turned ON by the user (step SC1), an operating system (OS) which has been stored in the storage unit 6 is developed on the RAM 3 to perform the operation confirmation and the initialization of the terminal apparatus (step SC2).

The request processing section B 26 sets a timer to be started at the predetermined time period at which the battery voltage is detected (step SC3).

An application program is started, and the display processing section 10 displays the screen of the application at the display unit 5 to wait for any input from the user. If there is the input, the control enters a normal processing state in which processing is performed by the input processing section 7, the data conversion processing section 8 and the data storage processing section 9 (Step SC4). In this state, the processing detecting section 11 detects the content of the processing which is performed in each processing section and the existence or non-existence of the processing. The processing detecting section 11 requests the switching of the operation state to the CPU 4 based on the detection result (step SC5).

Also, the power supply control processing section 20 controls ON/OFF of the power supply to be supplied to the peripheral circuits. When ON/OFF of the above power supply is switched, the power supply control processing section 20 notifies to the processing detecting section 11 that ON/OFF of the above power supply is switched.

When being started at the predetermined time period set as mentioned above, the request processing section B 26 issues a start notice of the power supply voltage detection to the processing detecting section 11 (step SC6).

When receiving the start notice of the power supply voltage detection, the processing detecting section 11 does not issue an operation state switching request to the CPU 4 and controls the CPU 4 to fix the current operation state (step SC7).

Also, the request processing section B 26 issues a detection request of the battery voltage to the power supply voltage detecting section 12 (step SC8).

The power supply voltage detecting section 12 detects a voltage value when receiving the detection request of the battery voltage (step SC9), and notifies the detecting result of the power supply voltage to the processing detecting section 11 (step SC10).

The processing detecting section 11 refers to the discharge quantity table stored in the storage unit 6 based on the operation state, the existence or non-existence of the operation of the peripheral circuit, and the detected power supply voltage to detect a remaining power quantity level (step SC11). The detected remaining power quantity level is displayed on the display unit 5 (step SC12). The processing detecting section 11 controls the CPU 4 to cancel the fixation of the operation state (step SC13). Then, the control returns to the normal processing state.

When a user turns OFF the power supply of the portable information terminal apparatus (step SC14) or there is no input from the user for a predetermined time, the processing detecting section 11 issues an operation state switching request to the CPU 4. As a result, the CPU 4 makes the portable information terminal apparatus transit to the operation state with the smallest power consumption quantity (step SC15). Even in this state, the request processing section B 26 is automatically started when the time reaches a detection time. The power supply voltage detecting section 12 repeats the processing to detect a power supply voltage.

Next, the wireless portable information terminal apparatus according to the fifth embodiment of the present invention will be described in detail with reference to the drawings. In the wireless portable information terminal apparatus according to the fifth embodiment, a re-detection function of the power supply voltage is added. In this case, a request for the detection of the power supply voltage once again is issued from the request processing section A 14 which is shown in the third embodiment when the peripheral circuit ON/OFF is switched during the power supply voltage detection.

Figure 14:
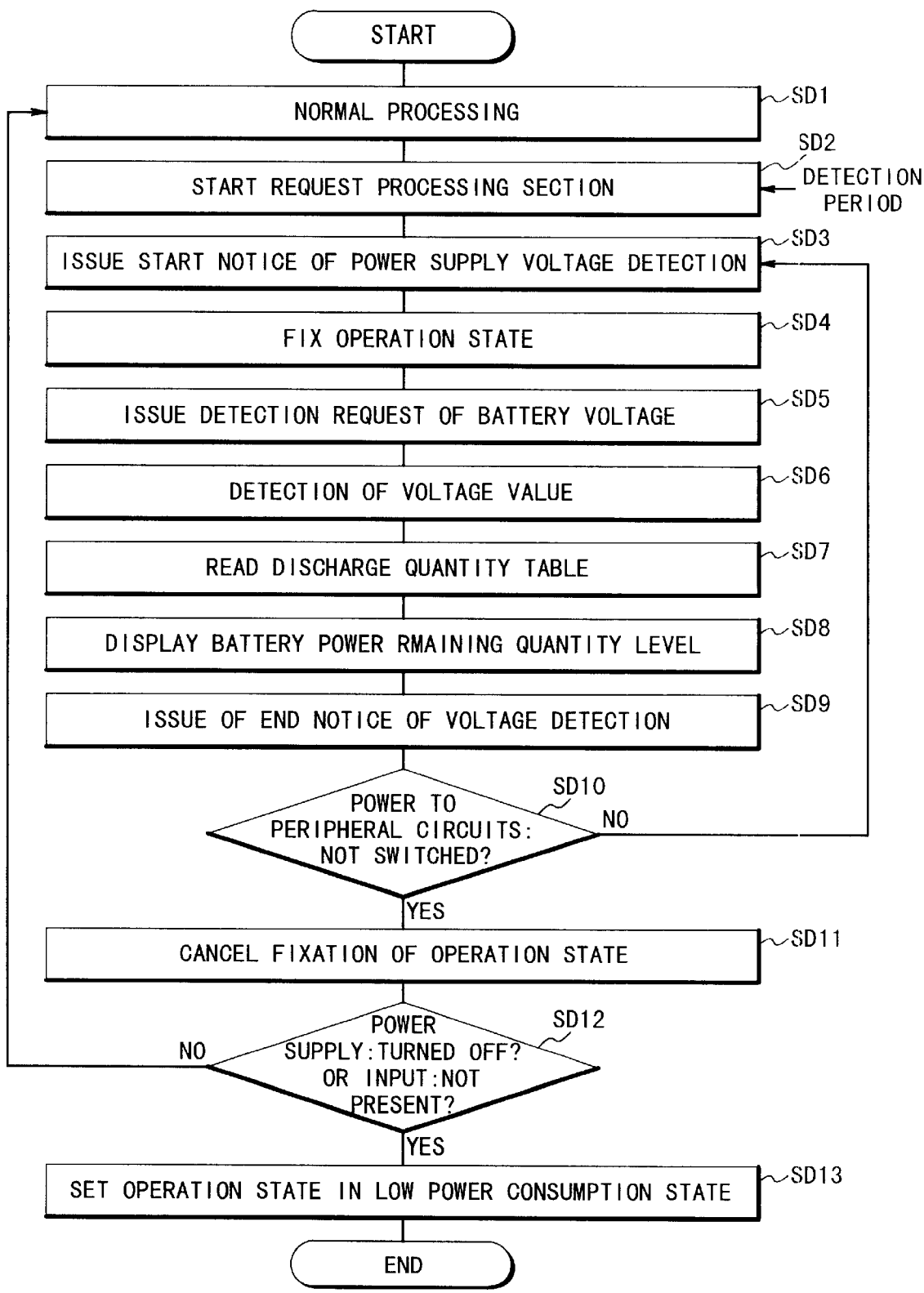
FIG. 14 is a flow chart used to explain the operation of the wireless portable information terminal apparatus according to a fifth embodiment of the present invention.

Next, the operation of the wireless portable information terminal apparatus according to the fifth embodiment of the present invention will be described. FIG. 14 is a flow chart illustrating the operation procedure of the wireless portable information terminal apparatus according to the fifth embodiment of the present invention. The operation of the fifth embodiment of the present invention will be explained in accordance with the flow chart of FIG. 14 with reference to the structural diagram of FIG. 11.

Referring to FIG. 14, in a case of the normal processing using the input processing section 7, the data conversion processing section 8 and the data storage processing section 9 (step SD1), the request processing section A 14 is started at every predetermined time period (step SD2). At this time, the requesting processing section A 14 issues a start notice of the power supply voltage to the processing detecting section 11 (step SD3).

When receiving the start notice of the power supply voltage detection, the processing detecting section 11 fixes the current operation state without issuing an instruction for switching the operation state to the CPU 4 (step SD4).

Further, the request processing section A 14 issues a detection request of the battery voltage to the power supply voltage detecting section 12 (step SD5).

When receiving the request, the power supply voltage detecting section 12 detects a voltage value (step SD6).

The remaining power quantity level detecting section 13 refers to the discharge quantity table based on the operation state, the existence or non-existence of the operation of the peripheral circuits and the detected power supply voltage to detect a remaining power quantity level (step SD7). The detected remaining power quantity level is displayed on the display unit 5 (step SD8).

When the power supply voltage detection is ended, the power supply voltage detecting section 12 notifies that the detection of the power supply voltage is ended, to the processing detecting section 11 (step SD9).

When receiving a detection end notice, the processing detecting section 11 confirms whether ON/OFF of the power supply to be supplied to the peripheral circuits is switched during the detection of the battery voltage (step SD10). When ON/OFF of the power supply to be supplied to the peripheral circuits is switched, the processing detecting section 11 abandons the received remaining power quantity level and maintains the operation state constant. At this time, the request processing section A 14 reissues the detection request of the battery voltage (step SD3).

When ON/OFF of the power supply to be supplied to the peripheral circuits is not switched in the step SD10, the processing detecting section 11 controls the CPU 4 to cancel the fixation of the operation state (step SD11). Then, the control returns to the normal processing state if the power supply is not turned off or if there is no input.

On the other hand, when the power supply is turned OFF or there is an input, the processing detecting section 11 issues a notice such that the wireless portable information terminal apparatus should be set to the operation state with the low power consumption. In response to this notice, the CPU 4 makes the terminal apparatus transit to the operation state with the low power consumption.

Next, the wireless portable information terminal apparatus according to the sixth embodiment of the present invention will be described below in detail. In the terminal apparatus of this embodiment, a function to set a request time period of the power supply voltage detection in accordance with the remaining power quantity level is provided in the request processing section which is shown in the first through fifth embodiments.

Next, the operation of the wireless portable information terminal apparatus according to the sixth embodiment of the present invention will be described. FIG. 15 is a flow chart illustrating the operation procedure of the portable information terminal apparatus according to the sixth embodiment of the present invention. The operation of the wireless portable information terminal apparatus will be described in accordance with the flow chart of FIG. 15 and with reference to the structure diagram of FIG. 11.

First, the request processing section A 14 sets a timer to be started at a time period at which the battery voltage is detected (step SE1). The normal processing is performed using the input processing section 7, the data conversion processing section 8 and the data storage processing section 9 (step SE2). Next, when being started at the time period set as mentioned above (step SE3), the request processing section A 14 issues a start notice of the power supply voltage detection to the processing detecting section 11 (step SE4).

When receiving the start notice of the power supply voltage detection, the processing detecting section 11 fixes the current operation state (step SE5), without issuing an instruction for switching the operation state to the CPU 4. Further, the request processing section A 14 issues a detection request of the battery voltage to the power supply voltage detecting section 12 when the operation state is fixed (step SE6).

The power supply voltage detecting section 12 detects a voltage value when receiving the detection request of the battery voltage (step SE7).

The remaining power quantity level detecting section 13 refers to the discharge quantity table based on the operation state, the existence or non-existence of the operation of the peripheral circuits and the detected power supply voltage to detect a remaining power quantity level (step SE8). The detected remaining power quantity level is displayed on the display unit (step SE9). Also, the remaining power quantity level detecting section 13 notifies the detected remaining power quantity level to the processing detecting section 11 (step SE10).

When receiving the notice, the processing detecting section 11 confirms whether or not ON/OFF of the power supply to be supplied to the peripheral circuits during detection of the battery voltage has been switched, to the power supply control processing section 20 (step SE11).

In this case, when ON/OFF of the power supply to be supplied to the peripheral circuits is switched during detection of the power supply voltage, the request processing section A 14 abandons the received remaining power quantity level and reissues the detection request of the battery voltage while the operation state is kept constant (step SE4).

When ON/OFF of the power supply to be supplied to the peripheral circuits is not switched during detection of the power supply voltage, the fixation of the operation state is canceled (step SE12). Also, the request processing section A 14 sets a long time period at which the battery voltage is detected, when the remaining power quantity level is large, and a short time period at which the battery voltage is detected, when the remaining power quantity level is small (step SE13).

In this case, when the power supply is turned ON by the power supply control processing section 20 or there is not an input (step SE14), the processing detecting section 11 issues a request to switch the operation state to the CPU 4. As a result, the terminal apparatus is set in an operation state with the low power consumption (step S15).

Also, in the step S14, when the power supply is turned OFF or there is an input, the control returns to the normal processing state using the input processing section 7, the data conversion processing section 8 and the data storage processing section 9 and so on (step S2), as mentioned above.

As described above, according to the present invention, the changes of the operation state and the existence or non-existence of the operation of the peripheral circuit are monitored. During the battery voltage detection, the operation state is kept constant. The battery level is detected from the detected voltage value. When the existence or non-existence of the operation of the peripheral circuit is changed during the detection of the battery voltage, the detection of the battery voltage is performed once again. Also, the period is set at which the detection request of the power supply voltage is issued in accordance with the remaining power quantity level.

Therefore, in the present invention, the detection of the battery voltage level can be correctly performed. Therefore, the wireless portable information terminal apparatus can be provided in which an erroneous operation of the terminal apparatus due to the decrease of the power supply voltage can be prevented. Also, in the wireless portable information terminal apparatus, it can be prevented that the stored data and programs are never destroyed because of an error operation.

Also, in the present invention, the power is never unnecessarily consumed for the detection of the battery voltage. Therefore, the wireless portable information terminal apparatus can be provided in which the use time of the terminal apparatus can be extended.

Further, in the present invention, a plurality of discharge quantity tables corresponding to the operation state of the terminal apparatus and the existence or non-existence of the operation of the peripheral circuits are previously provided. Therefore, the wireless portable information terminal apparatus can be provided in which the detection of the battery voltage can be realized with low cost and small size by addition of a simple circuit or a program.

What is claimed is:

1. A portable information terminal system including a CPU and peripheral circuits, comprising:
   a power supply;
   a discharge quantity table for storing remaining power levels, each of which is defined based on a system state of said portable information terminal system and a voltage of said power supply;
   a voltage detecting unit for detecting said power supply voltage in response to a voltage detection request; and
   a control section for monitoring said system state, for issuing said voltage detection request in response to a voltage check request, for referring to said discharge quantity table based on said power supply voltage detected by said voltage detecting unit and said monitored system state to determine said remaining power level of said power supply.

2. A portable information terminal system according to claim 1, wherein said system state corresponds to at least one of a state of supply of a clock signal to said CPU and said peripheral circuits and a state of supply of power to said peripheral circuits.

3. A portable information terminal system according to claim 1, further comprising a check request generating section for periodically issuing said voltage check request to said control section at every predetermined time period.

4. A portable information terminal system according to claim 3, wherein said predetermined time period is set by a user.

5. A portable information terminal system according to claim 3, further comprising a time period setting section for automatically setting said predetermined time period.

6. A portable information terminal system according to claim 5, wherein said time period setting section sets said predetermined time period based on said detected remaining power level.

7. A portable information terminal system according to claim 1, further comprising:

a locking section for locking an operation of said CPU in response to a lock instruction, wherein said control section further issues said lock instruction to said locking section in response to said voltage check request.

8. A portable information terminal system according to claim 1, wherein said control section issues said voltage check request to said voltage detecting unit again when it is detected that an operation state of any of said peripheral circuits is changed during the power supply voltage detection.

9. A portable information terminal system according to claim 8, wherein said control section detects whether the operation state of any of said peripheral circuit is changed, based on a processing amount of said peripheral circuits.

10. A portable information terminal system according to claim 1, further comprising:

a display unit; and a display control section for displaying a data corresponding to said determined remaining power on said display unit.

11. A method of determining a remaining power level of a power supply in a portable information terminal system including a CPU and peripheral circuits, comprising the steps of:

monitoring a system state of the portable information terminal system;

issuing a voltage detection request in response to a voltage check request;

detecting a power supply voltage in response to said voltage detection request; and referring to a discharge quantity table based on said power supply voltage detected by said voltage detecting unit and said monitored system state to determine said remaining power level of said power supply, wherein said discharge quantity table includes a plurality of remaining power levels, each of which is defined with respect to said system state and said power supply voltage.

12. A method according to claim 11, wherein said system state corresponds to at least one of a state of supply of a clock signal to said CPU and said peripheral circuits and a state of supply of power to said peripheral circuits.

13. A method according to claim 11, further comprising the step of periodically issuing said voltage check request to said control section at every predetermined time period.

14. A method according to claim 13, further comprising the step of setting said predetermined time period by a user.

15. A method according to claim 13, further comprising the step of automatically setting said predetermined time period.

16. A method according to claim 15, wherein said automatically setting step includes automatically setting said predetermined time period based on said detected remaining power level.

17. A method according to claim 11, further comprising the steps of issuing a lock instruction in response to said voltage check request; and locking an operation of said CPU in response to a lock instruction.

18. A method according to claim 11, further comprising the steps of:

determining whether an operation state of any of said peripheral circuits is changed during the power supply voltage detection; and issuing said voltage check request again when it is determined that an operation state of any of said peripheral circuits is changed during the power supply voltage detection.

19. A method according to claim 11, further comprising the step of displaying data corresponding to said determined remaining power on said display unit.

20. A portable information terminal system according to claim 1, wherein the system state is defined as one of a large power consumption state and a small power consumption state.

21. A method according to claim 11, wherein the system state is defined as one of a large power consumption state and a small power consumption state.

\* \* \* \* \*